(12) United States Patent
Park et al.

(10) Patent No.: US 6,278,160 B1
(45) Date of Patent: Aug. 21, 2001

(54) SEMICONDUCTOR DEVICE HAVING A RELIABLY-FORMED NARROW ACTIVE REGION

(75) Inventors: Yong Park, Seoul; Han-Soo Kim, Kyunggi-do, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/221,979

(22) Filed: Dec. 29, 1998

(30) Foreign Application Priority Data

Dec. 31, 1997 (KR) .................................................. 97/80569

(51) Int. Cl.[7] .......................... H01L 31/119; H01L 21/336
(52) U.S. Cl. .......................... 257/377; 257/378; 257/379; 438/258
(58) Field of Search .................................. 257/377, 378, 257/379; 438/258, 241

(56) References Cited

U.S. PATENT DOCUMENTS

| 5,565,383 | * | 10/1996 | Sakai ................................ 437/200 |
| 5,648,673 | * | 7/1997 | Yasuda et al. .................... 257/382 |

* cited by examiner

*Primary Examiner*—Olik Chaudhuri
*Assistant Examiner*—Shrinivas H. Rao
(74) *Attorney, Agent, or Firm*—Jones Volentine, PLLC

(57) ABSTRACT

A method of fabricating a semiconductor device is provided. In this method, a gate insulating layer and a gate are sequentially formed on a semiconductor substrate of a first conductivity type. A first active region of a second conductivity type is formed by ion-implanting a first impurity of the second conductivity type at a first dose, using the gate as a mask. Sidewall spacers are formed of an insulating material on the sidewalls of the gate. A second active region of the second conductivity type is formed by masking a narrow region between gates and ion-implanting a second impurity of the second conductivity type at a second dose higher than the first dose. Finally, a silicide layer is formed on the exposed first and second active regions and gate. There exist no impurities in excess of their solid solubility limit, which could block the diffusion of silicon in the narrow region. As a result, a reliable silicidation is ensured.

6 Claims, 3 Drawing Sheets

US 6,278,160 B1

SEMICONDUCTOR DEVICE HAVING A RELIABLY-FORMED NARROW ACTIVE REGION

BACKGROUND OF THE INVENTION

1. Field of the Invention

The present invention relates to a method of fabricating a semiconductor device, and in particular, to a semiconductor device fabrication method that ensures reliable silicidation on a narrow active region.

2. Description of the Related Art

As semiconductor devices develop toward high integration, high performance, and low voltage operation, a low-resistance gate material is required to reduce the gate length of a transistor and a memory cell through the formation of fine patterns and to improve the device's characteristics. The thickness of a gate insulating layer must in turn become smaller to increase a channel current in a transistor and a memory cell for low voltage operation. Furthermore, in order to prevent short channel effects caused by the decrease in the gate length of a transistor and to ensure a margin against punch-through, the junction depth of the source/drain regions should be reduced and the parasitic resistance, that is, the surface resistance and the contact resistance of the source/drain regions should be reduced.

Under these circumstances, studies have been conducted on a self-aligned silicide (salicide) process to reduce the resistivity of a gate and the sheet and contact resistance of source/drain regions. This self-aligned silicide process operates by forming a silicide layer on the surfaces of the gate and the source/drain regions. The salicide process refers to the selective formation of a silicide layer such as a titanium silicide (TiSiX) layer on a gate electrode and source/drain regions.

FIG. 1 is a vertical sectional view of an N-channel MOS (Metal Oxide Semiconductor) transistor fabricated by a conventional salicide process. As shown in FIG. 1, a gate insulating layer 12 is grown by performing a thermal oxidation on the surface of a silicon substrate 10 that has an active region on it, defined by a field oxide film (not shown). A conductive layer such as a polysilicon is then deposited for use as a gate, on the gate insulating layer 12 by CVD (Chemical Vapor Deposition). The polysilicon layer is then doped to be of an N-type by ion implantation and is then patterned into a gate 14 by photolithography.

Subsequently, $N^-$ active regions 16 are formed as lightly doped drain (LDD) regions on the surface of the substrate 10 at opposite sides of the gate 14 by ion-implanting an N-type dopant. In particular, phosphorous (P) may be used at a low dose (e.g., at a dose of $1 \times 10^{13} - 9 \times 10^{14}$ ions/cm$^2$) with the gate 14 being used as an ion-implanting mask.

Spacers 18 are then formed on the sidewalls of the gate 14 by depositing an insulating layer on the resultant structure, including the $N^-$ active regions 16, and then etching back the insulating layer by anisotropical etching such as RIE (Reactive Ion Etching). Here, the insulating layer is formed of a silicidation blocking material, such as a nitride or an oxide. Then, $N^+$ active regions 20 are formed as high-concentration source/drain regions on the surface of the substrate 10 at opposite sides of the spacers 18 by ion-implanting an N-type dopant. In particular, arsenic (As) may be used at a high dose (e.g., at or above a dose of $1 \times 10^{15}$ ions/cm$^2$) with the spacers 18 and the gate 14 being used as an ion-implanting mask.

Afterwards, a silicide forming metal material, such as titanium (Ti) is deposited on the resultant structure, including the $N^+$ active regions 20, and the titanium is subjected to rapid thermal annealing (RTA) or thermal treatment using a furnace so that silicidation takes place in an area where the titanium contacts silicon. As a result, a titanium silicide (TiSi$_2$) layer is formed on the surfaces of the exposed $N^-$ and $N^+$ active regions 16 and 20 and on the gate 14. Then, an unreacted titanium layer is selectively removed, using an etchant which does not damage the silicide layer 22, the silicon substrate 10, or the gate insulating layer 12.

A problem with the conventional method is incomplete silicidation on the surface of a narrow active region (see "A" of FIG. 1). This is believed to be caused by the impurity concentration in the silicon substrate 10. In other words, with the ion-implantation on the silicon substrate 10 at or above a dose of $1 \times 10^{15}$ ions/cm$^2$, impurities contained in the silicon in excess of their solid solubility limit are segregated or piled up at the titanium/silicon interface, thereby blocking the diffusion of silicon. This phenomenon is observed to be more serious with arsenic than with phosphorous.

As a result, the diffusion of silicon is more difficult in the narrow region A of FIG. 1 between gates 14, than in the remainder of the device. This can lead to incomplete silicidation as compared to a wide region or an increased sheet resistance. For example, when the source region of a transistor, coupled to a common source terminal ($V_{ss}$) of memory cells, is narrow, silicon of a substrate is not sufficiently diffused in the narrow region during the step of forming a titanium silicide layer. As a result, the sheet resistance from the source region to a $V_{ss}$ pattern may increase. In a worse case situation, no silicide layer may be formed at all, thereby reducing a voltage margin in a low-voltage operation area of a device.

SUMMARY OF THE INVENTION

An object of the present invention is to provide a semiconductor device fabricating method which can minimize or prevent unreliable silicidation on a narrow active region.

To achieve the above object, there is provided a method of fabricating a semiconductor device. In the method, a plurality of gate insulating layers and a plurality of gates are sequentially formed on a semiconductor substrate of a first conductivity type. A first active region of a second conductivity type is then formed in the semiconductor substrate by ion-implanting a first impurity of the second conductivity type at a first dose, using the plurality of gates as a mask. Sidewall spacers are then formed of an insulating material on the sidewalls of the plurality of gates. A second active region of the second conductivity type in the semiconductor substrate by masking a narrow portion of the first active region between at least two of the plurality of gates and ion-implanting a second impurity of the second conductivity type at a second dose higher than the first dose. A first suicide layer is then formed over exposed portions of the first and second active regions.

Preferably, the first dose is $1 \times 10^{13}$ ions/cm$^2$ or higher, and the second dose is $1 \times 10^{15}$ ions/cm$^2$ or higher.

Preferably, the step of forming a first silicide layer comprises the substeps of: depositing a first metal layer over the exposed portions of the first and second active regions, and thermally treating the first metal layer to form the first silicide layer.

Preferably, the step of sequentially forming a plurality of gate insulating layers and a plurality of gates further comprises the substeps of: forming a first insulating layer over the semiconductor substrate, forming a conductive layer over the first insulating layer, and patterning the first insulating layer and the conductive layer to form the plurality of gate insulating layers and the plurality of gates, respectively.

The method for fabricating a semiconductor device may further comprise the step of forming a second silicide layer over the plurality of gates. The step of forming the second silicide layer may itself comprise the substeps of: depositing a second metal layer over the plurality of gates, and thermally treating the second metal layer to form the second silicide layer.

According to another aspect of the present invention, another method of fabricating a semiconductor device is provided. In this method, a plurality of gate insulating layers and a plurality of gates are sequentially formed over a semiconductor substrate of a first conductivity type. A first active region of a second conductivity type is then formed in the semiconductor substrate by ion-implanting a first impurity of the second conductivity type at a first dose, using the plurality of gates as a mask. Sidewall spacers are then formed of an insulating material on the sidewalls of the plurality of gates. A second active region of the second conductivity type is formed in the semiconductor substrate by masking a portion of the first active region and ion-implanting a second impurity of the second conductivity type at a second dose higher than the first dose. A first silicide layer is then formed over exposed portions of the first and second active regions.

The first dose may be $1 \times 10^{13}$ ions/cm$^2$ or higher, and the second dose may be $1 \times 10^{15}$ ions/cm$^2$ or higher. The step of forming a first layer may comprise the substeps of depositing a first metal layer over the exposed portions of the first and second active regions, and thermally treating the first metal layer to form the first silicide layer.

The step of sequentially forming a plurality of gate insulating layers and a plurality of gates may further comprise the substeps of: forming a first insulating layer over the semiconductor substrate, forming a conductive layer over the first insulating layer, and patterning the first insulating layer and the conductive layer to form the plurality of gate insulating layers and the plurality of gates, respectively.

The method for fabricating a semiconductor device may also comprise the step of forming a second suicide layer over the plurality of gates. The step of forming the second silicide layer may itself comprise the substeps of: depositing a second metal layer over the plurality of gates, and thermally treating the second metal layer to form the silicide layer.

According to yet another aspect of the invention, a semiconductor device is provided, including a plurality of gate insulating layers formed over a semiconductor substrate of a first conductive type, a plurality of gates formed over the gate insulating layers, a first active region formed in the semiconductor substrate between the plurality of gates, a second active region, narrower than the first active region, formed in the semiconductor substrate between the plurality of gates, and a first silicide layer formed over the first active region and the second active region.

The first active region preferably includes a first impurity layer of a second conductivity type having a first impurity concentration, and a second impurity layer of the second conductivity type having a second impurity concentration higher than the first impurity concentration. The second active region preferably includes a third impurity layer of the second conductivity type having a third impurity concentration substantially the same as the first impurity concentration. The semiconductor device may also include a second silicide layer formed over the plurality of gates.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE PREFERRED EMBODIMENT

FIGS. 2 to 6 are sectional views of the creation of an N-channel MOS transistor. They are referred to for describing a semiconductor device fabricating method according to a preferred embodiment of the present invention.

Figure 1:
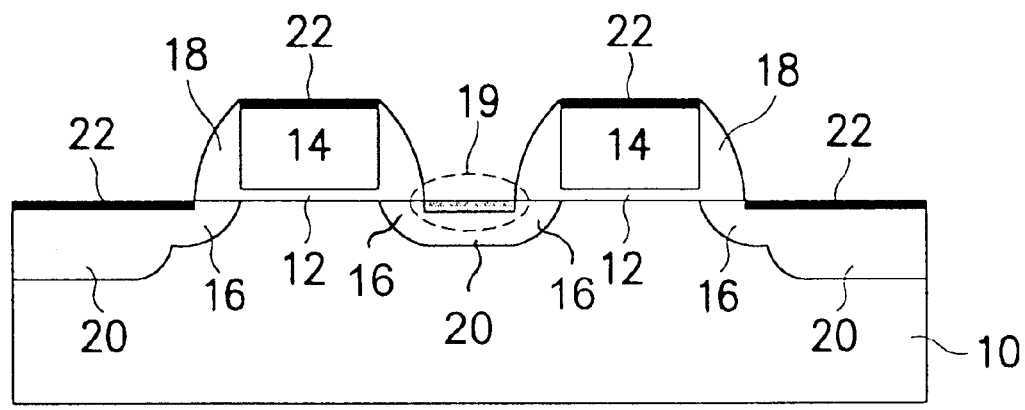
FIG. 1 is a vertical sectional view of a semiconductor device fabricated by a conventional salicide process.
Figure 2:
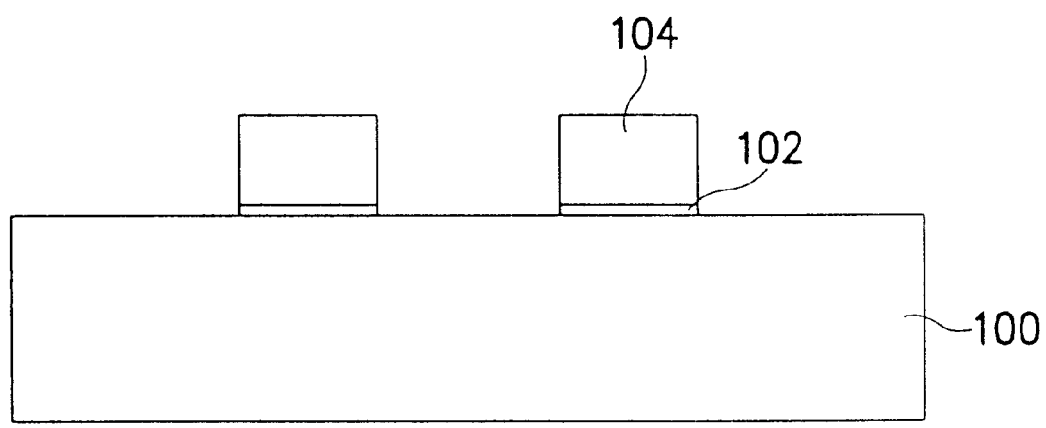
FIGS. 2 to 6 are sectional views sequentially illustrating a semiconductor device fabricating method according to the present invention.

FIG. 2 illustrates the step of forming a gate 104. A first insulating layer is first grown by performing a thermal oxidation on the surface of a silicon substrate 100 having an active region defined thereon by a field oxide film (not shown). A conductive layer is then formed over the first insulating layer to serve as a gate. A polysilicon layer formed by CVD may be used as this conductive layer. The polysilicon layer is then doped to be of an—type by ion-implantation and the polysilicon layer and the first insulating layer are then patterned into the gate insulating layers 102 and the gates 105 by photolithography. In this process, the N-doped polysilicon layer/may be deposited by CVD without ion-implantation.

Figure 3:
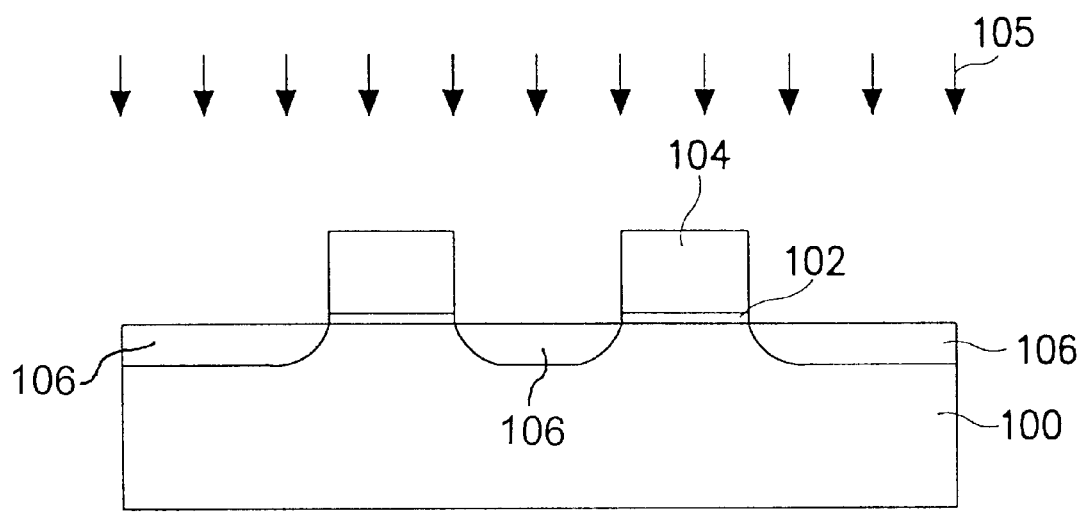

FIG. 3 illustrates the step of forming an N$^-$ active region 106. Following the formation of the gate 104, N$^-$ active regions 106 are formed as LDD regions on the surface of the substrate 100 at opposite sides of the gate 104 by ion-implanting an N-type dopant 105 using the gate 104 as an ion-implanting mask, phosphorous at a dose of $1 \times 10^{13}$ ions/cm$^2$ or above may be used.

Figure 4:
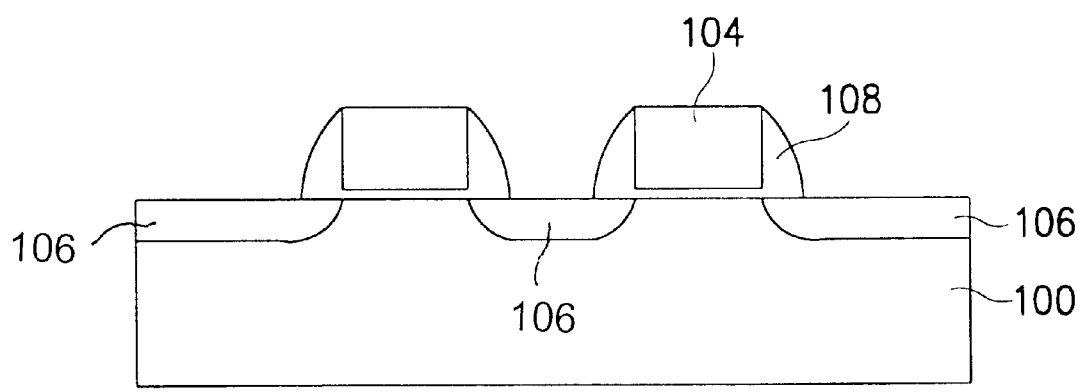

FIG. 4 illustrates the step of forming sidewall spacers 108. After the N$^-$ active regions 106 are formed, an insulating layer is deposited on the resultant structure. Then, the insulating layer is etched back by anisotropical etching such as RIE, to thereby forming spacers 108 on the sidewalls of the gate 104. In this process, it is preferable to form the insulating layer of a silicidation blocking material, such as a nitride or an oxide.

Figure 5:
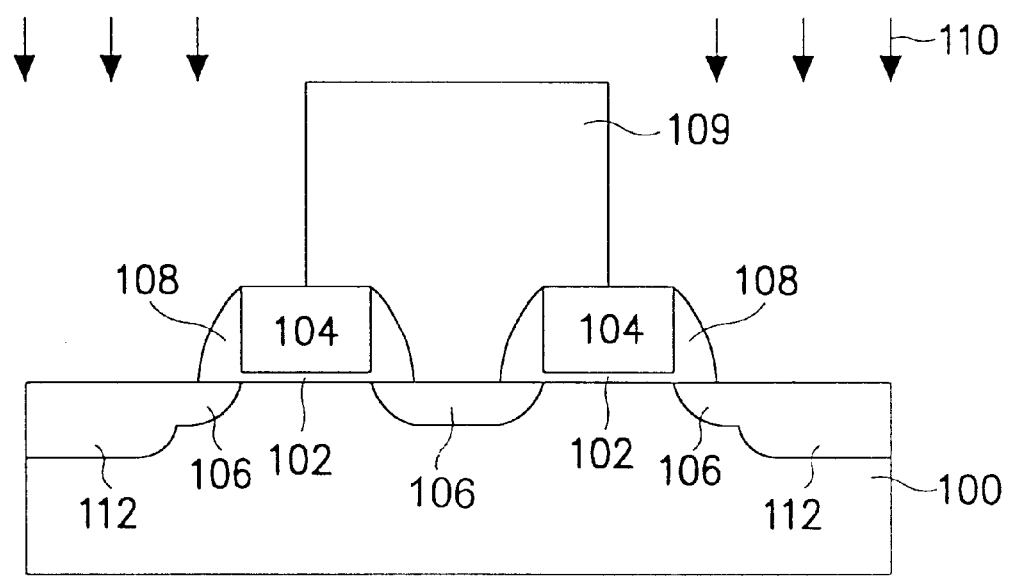

FIG. 5 illustrates the step of forming an N$^+$ active region 112. Subsequent to the formation of the sidewall spacers 108, a photoresist pattern 109 is formed by photolithography, to mask a narrow region between gates 104. Assuming that the length of the sidewall spacers 108 is 0.15 $\mu$m, the distance between the gates 104 is between 0.35 and 0.5 $\mu$m, and thus the active region is about 0.1 $\mu$m long. This region is masked by the photoresist pattern 109.

Then, N$^+$ active regions 112 are formed as high-concentration source/drain regions on the surface of the substrate 100 at opposite sides of the sidewall spacers 108 by ion-implanting an N-type dopant 110 using the photoresist pattern 109 used as an ion-implanting mask. The dopant 110 may be, for example, arsenic at a dose of $1 \times 10^{15}$ ions/cm$^2$ or above. Because the region masked by the photoresist pattern 109 experiences no N$^+$ ion-implantation, there exist no impurities beyond their solid solubility which block silicon diffusion in the masked region.

Figure 6:
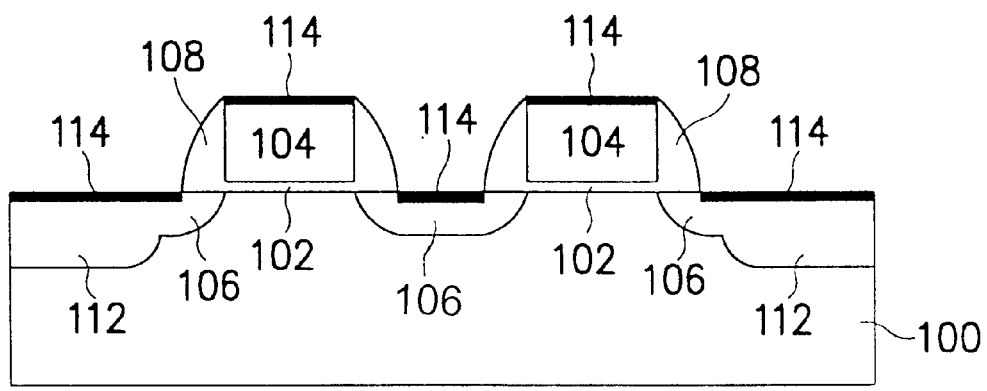

FIG. 6 illustrates the step of forming a silicide layer 114. After the N$^+$ active regions 112 are formed, the photoresist pattern 109 is removed. Then, a silicide forming metal material such as titanium, cobalt (Co), or tantalum (Ta) is deposited on the resultant structure. The metal material is subjected to RTA or thermal annealing using a furnace so that silicidation takes place in an area where the metal material contacts silicon. As a result, the silicide layer 114, such as a titanium silicide (TiSi$_2$) layer, a cobalt silicide (CoSi$_2$) layer, or tantalum silicide (TaSi$_2$) layer, is formed on the surfaces of the exposed active regions 106 and 112, and the gate 104. Then, any unreacted titanium layer is selectively removed, using an etchant which does not damage the silicide layer 114, the silicon substrate 100, or the gate insulating layer 102.

Though not shown, a contact window is formed to expose portions of the N$^+$active regions 112 by depositing an insulating layer on the resultant structure having the silicide layer 114 formed thereon and anisotropically etching the insulating layer. The etching may be carried out, for example, by RIE in a photolithography process. A metal layer is then formed to contact with the N$^+$ active region 112 or the silicide layer 114 by filling the contact window with a metal. In this way, an intended transistor can be driven.

In another preferred embodiment, the above fabricating method can find its applications in a semiconductor device with a narrow active region produced by a short distance between a gate edge and an active region edge, that is, between a gate edge and a field region.

The present invention, as described above, avoids ion-implantation at a high dose in a narrow region between gates or a narrow active region by masking the narrow region. As a result, there is no impurity beyond its solid solubility, which blocks diffusion of silicon in the narrow region.

While the present invention has been described in detail with reference to the specific embodiment, it is a mere exemplary application. Thus, it is to be clearly understood that many variations can be made by anyone skilled in the art within the scope and spirit of the present invention.

What is claimed is:

1. A semiconductor device, comprising:
   a gate insulating layer formed over a semiconductor substrate of a first conductivity type;
   a gate formed over the gate insulating layer;
   a first active region formed in the semiconductor substrate under a first sidewall of the gate, the first active region comprising a first impurity layer of a second conductivity type having a first impurity concentration, and a second impurity layer of the second conductivity type having a second impurity concentration higher than the first impurity concentration;
   a second active region, narrower than the first active region, formed in the semiconductor substrate under a second sidewall of the gate opposed to the first sidewall of the gate, the second active region consisting essentially of a third impurity layer of the second conductivity type having the first impurity concentration; and
   a first silicide layer formed over the first active region and the second active region.

2. A semiconductor device, as recited in claim 1 further comprising a second silicide layer formed over the gate.

3. A semiconductor device, as recited in claim 1, wherein the first impurity concentration is a dose of $1 \times 10^{13}$ ions/cm$^2$ or higher.

4. A semiconductor device, comprising:
   a first insulating layer and a second insulating layer formed over a semiconductor substrate of a first conductivity type;
   a first gate formed over the first insulating layer;
   a second gate formed over the second insulating layer;
   a first active region formed in the semiconductor substrate under a first sidewall of the first gate, the first active region comprising a first impurity layer of a second conductivity type having a first impurity concentration, and a second impurity layer of the second conductivity type having a second impurity concentration higher than the first impurity concentration;
   a second active region formed in the semiconductor substrate under a first sidewall of the second gate, the second active region comprising a third impurity layer of the second conductivity type having the first impurity concentration, and a fourth impurity layer of the second conductivity type having the second impurity concentration; substantially the same as the first impurity concentration;
   a third active region, narrower than the first and second active regions, formed in the semiconductor substrate between a second sidewall of the first gate opposed to the first sidewall of the first gate and a second sidewall of the second gate opposed to the first sidewall of the second gate, the third active region comprising a fifth impurity layer of the second conductivity type having the first impurity concentration; and
   a first silicide layer formed over the first active region, the second active region, and the third active region.

5. A semiconductor device, as recited in claim 4, further comprising a second silicide layer formed over the first and second gates.

6. A semiconductor device, as recited in claim 4; wherein the first impurity concentration is a dose of $1 \times 10^{15}$ ions/cm$^2$ or higher.

* * * * *

UNITED STATES PATENT AND TRADEMARK OFFICE
CERTIFICATE OF CORRECTION

PATENT NO. : 6,278,160 B1 Page 1 of 1
APPLICATION NO. : 09/221979
DATED : August 21, 2001
INVENTOR(S) : Yong Park et al.

It is certified that error appears in the above-identified patent and that said Letters Patent is hereby corrected as shown below:

Column 6, lines 31-32, delete "substantially the same as the first impurity concentration;"

Signed and Sealed this

Twenty-second Day of May, 2007

JON W. DUDAS
*Director of the United States Patent and Trademark Office*